United States Patent
Edwards

(10) Patent No.: US 10,881,022 B2
(45) Date of Patent: Dec. 29, 2020

(54) THERMAL INTERFACE ASSEMBLY

(71) Applicant: TRW AUTOMOTIVE U.S. LLC, Livonia, MI (US)

(72) Inventor: Darryl J. Edwards, Novi, MI (US)

(73) Assignee: TRW AUTOMOTIVE U.S. LLC, Livonia, MI (US)

(*) Notice: Subject to any disclaimer, the term of this patent is extended or adjusted under 35 U.S.C. 154(b) by 0 days.

(21) Appl. No.: 16/032,192

(22) Filed: Jul. 11, 2018

(65) Prior Publication Data
US 2020/0018562 A1 Jan. 16, 2020

(51) Int. Cl.
*H05K 7/20* (2006.01)

(52) U.S. Cl.
CPC .......... *H05K 7/2039* (2013.01); *H05K 7/209* (2013.01); *H05K 7/2089* (2013.01); *H05K 7/20409* (2013.01); *H05K 7/20509* (2013.01); *H05K 7/20854* (2013.01); *H05K 7/20863* (2013.01); *H05K 7/20963* (2013.01); *H05K 7/20972* (2013.01); *H05K 7/20418* (2013.01); *H05K 7/20427* (2013.01); *H05K 7/20845* (2013.01); *H05K 7/20909* (2013.01)

(58) Field of Classification Search
CPC .. H05K 7/2036; H05K 7/209; H05K 7/20863; H05K 7/20972; H05K 7/20409; H05K 7/2089; H05K 7/20963; H05K 7/20854; H05K 7/20509; H05K 7/20418; H05K 7/20427; H05K 7/20909; H05K 7/20454; H05K 7/20472; H05K 7/20845; F28F 2013/006

USPC .......................................................... 361/704
See application file for complete search history.

(56) References Cited

U.S. PATENT DOCUMENTS

| | | | |
|---|---|---|---|
| 5,781,992 A | 7/1998 | Moscicki | |
| 5,926,369 A | 7/1999 | Ingraham et al. | |
| 5,991,155 A * | 11/1999 | Kobayashi | H01L 23/3672 165/80.2 |
| 6,097,598 A | 8/2000 | Miyahara et al. | |
| 6,765,798 B1 * | 7/2004 | Ratliff | H05K 7/20445 165/185 |
| 9,445,528 B2 | 9/2016 | Cohen et al. | |
| 2005/0180113 A1 * | 8/2005 | Shirakami | H01L 23/373 361/704 |
| 2008/0238323 A1 | 10/2008 | Chan et al. | |
| 2012/0033384 A1 * | 2/2012 | Pillai | H05K 7/20445 361/718 |
| 2014/0332193 A1 | 11/2014 | Oh et al. | |
| 2015/0301568 A1 | 10/2015 | Hill et al. | |
| 2016/0004284 A1 * | 1/2016 | Cohen | G06F 1/20 361/679.54 |
| 2016/0282054 A1 * | 9/2016 | Hirasawa | F28D 15/0275 |
| 2018/0007181 A1 | 1/2018 | Lee et al. | |

* cited by examiner

*Primary Examiner* — Anatoly Vortman
*Assistant Examiner* — Zhengfu J Feng
(74) *Attorney, Agent, or Firm* — Tarolli, Sundheim, Covell & Tummino LLP

(57) ABSTRACT

A thermal interface assembly for transferring heat from a heat generating component to a heat dissipating component. The thermal interface assembly includes a plurality of discrete thermal sheets attached to a resilient pad.

15 Claims, 10 Drawing Sheets

THERMAL INTERFACE ASSEMBLY

FIELD OF THE INVENTION

The present invention relates to the assembly of electronics and, in particular, to a thermal interface assembly that can be used to secure a heat generating component to a heat dissipating component.

BACKGROUND TO THE INVENTION

It is known to use thermal interface material to attach a heat dissipating component to a heat generating component in electronic devices. The thermal interface material promotes the transfer of heat from the heat generating component to the heat dissipating component. Thermal interface materials are generally stiff, which can result in the application of high compressive forces during assembly of electronic devices. However, such high compressive forces are undesirable, as they can cause damage to the heat generating component and/or the heat dissipating component. It has been suggested to decrease the stiffness of the thermal interface material (i.e., increase flexibility) by adding various filler material. However, the addition of filler material decreases thermal conductivity. Thus, what is needed is an assembly that is flexible and has good thermal conductivity.

One solution has been to provide an assembly 100 (FIG. 1) that includes a thermal sheet 106 attached to a resilient pad 103 by an adhesive 151. The assembly 100 can be used to transfer heat from a heat generating component to a heat dissipating component. However, it is desired to improve heat transfer from heat generating components to heat dissipating components, as heat transfer along the in-plane path of the known assembly 100 is relatively long.

SUMMARY OF THE INVENTION

According to one aspect of the invention, a thermal interface assembly for connecting a heat dissipating component to a heat generating component includes a resilient pad having first and second opposite surfaces. The assembly further includes a plurality of discrete thermal sheets. Each of the plurality of discrete thermal sheets is configured to transfer heat from the heat generating component to the heat dissipating component along an in-plane path. Each of the plurality of thermal sheets has first and second heat transfer portions interconnected by a interconnecting portion. The first heat transfer portion is attached to the first surface of the resilient pad. The second heat transfer portion is attached to the second surface of the resilient pad. The interconnecting portion extends about an edge of the pad.

According to another aspect of the invention, a thermal interface assembly includes a resilient pad and a plurality of discrete thermal sheets. Each of the plurality of discrete thermal sheets is configured to transfer heat from the heat generating component to the heat dissipating component along an in-plane path. Each of the plurality of thermal sheets as a first surface and a second surface. Each of the plurality of thermal sheets is attached to the pad such that the first surface faces toward the pad and the second surface faces away from the pad.

According to another aspect of the invention, an electronic assembly a thermal interface assembly for connecting a heat dissipating component to a heat generating component includes a resilient pad having first and second opposite surfaces. The assembly further includes a plurality of discrete thermal sheets. Each of the plurality of discrete thermal sheets is configured to transfer heat from the heat generating component to the heat dissipating component along an in-plane path. Each of the plurality of thermal sheets has first and second heat transfer portions interconnected by a interconnecting portion. The first heat transfer portion is attached to the first surface of the resilient pad. The second heat transfer portion is attached to the second surface of the resilient pad. The interconnecting portion extends about an edge of the pad. A heat generating component is attached to the first heat transfer portion. A heat dissipating component is attached to the second heat transfer portion. Each of the plurality of discrete thermal sheets is configured to transfer heat from the heat generating component to the heat dissipating component along an in-plane path.

BRIEF DESCRIPTION OF THE DRAWINGS

Embodiments of the invention will now be described by way of example only, with reference to the accompanying drawings, in which:

FIG. 14 is a perspective view of a pad that makes up part of the thermal interface assembly of FIG. 10;

DETAILED DESCRIPTION

Figure 1:
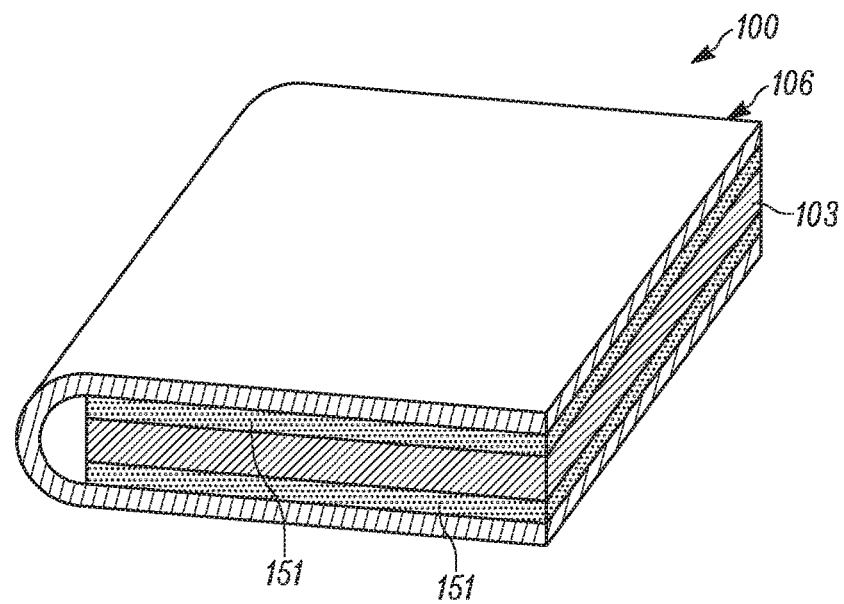
FIG. 1 is a perspective view of a known thermal assembly.
Figure 2:
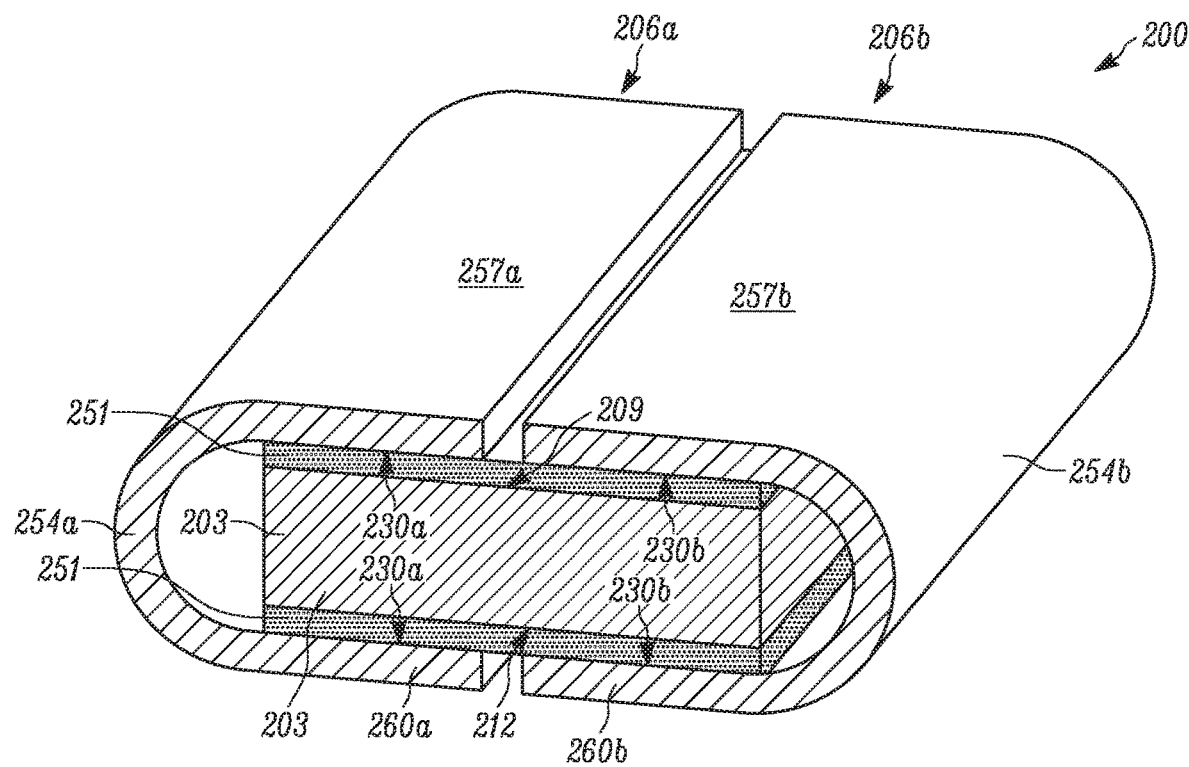
FIG. 2 is a perspective view of a thermal interface assembly according to one embodiment of the invention.
Figure 3:
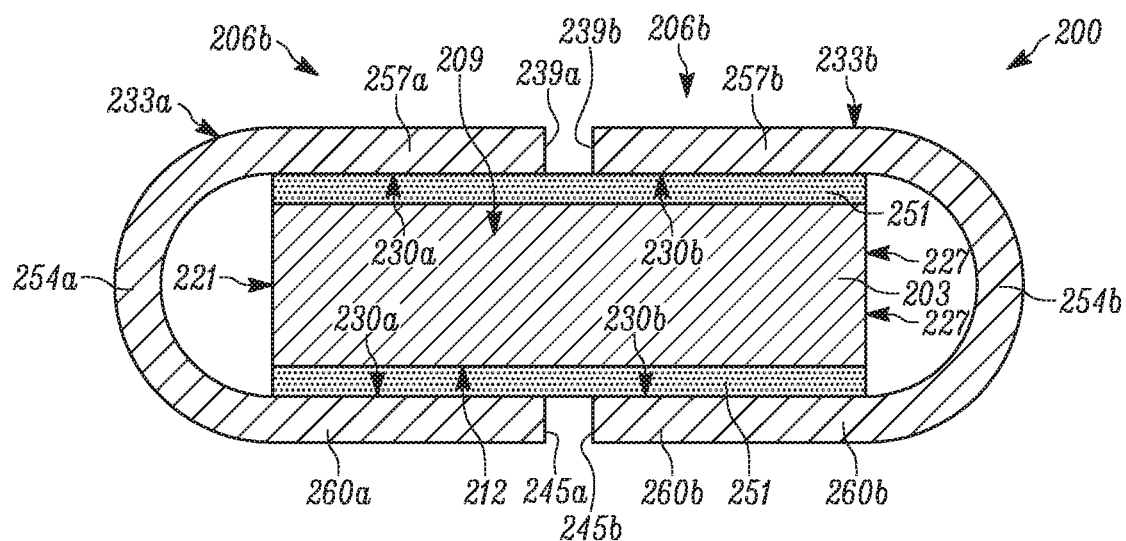
FIG. 3 is a side view of the thermal interface assembly of FIG. 2.
Figure 4:
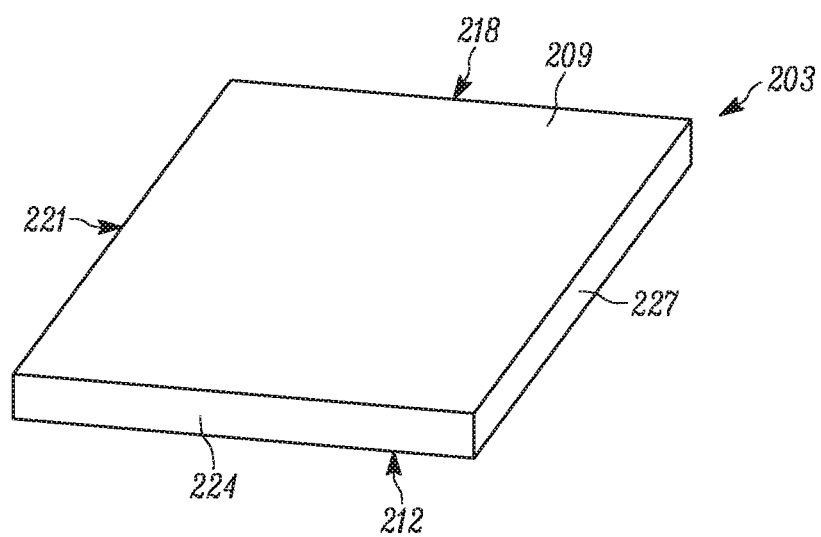
FIG. 4 is a perspective view of a pad that makes up part of the thermal interface assembly of FIG. 2.

A thermal interface assembly 200 according to one embodiment of the invention is shown in FIGS. 2-5. The thermal interface assembly 200 includes a resilient pad 203 and two thermal sheets 206a, 206b. The pad (FIG. 4) includes a first surface 209 and a second surface 212. The first and second surfaces 209, 212 are bound by opposed first and second ends 221, 227 and opposed first and second edges 218, 224 that extend between the ends. The pad 203 can be manufactured out of any soft material (e.g., open cell or closed cell foam).

Figure 5:
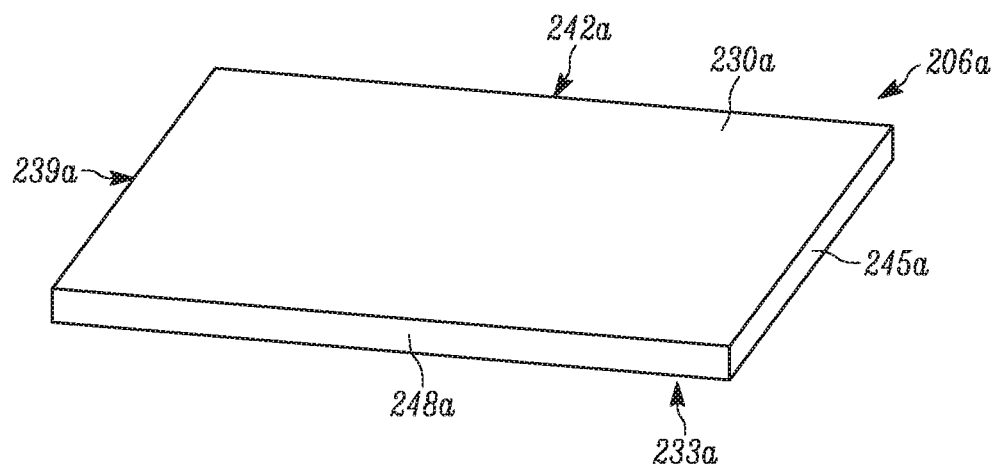
FIG. 5 is a perspective view of a thermal sheet that makes up part of the thermal assembly of FIG. 2.

The two thermal sheets 206a, 206b are substantially identical to one another. As such, the discussion of the thermal sheets 206a, 206b will be made with reference to a single thermal sheet 206a (FIG. 5). The thermal sheet 206a includes a pad facing surface 230a and a component facing surface 233a. The pad facing surface 230a and the component facing surface 233a are bound by opposed first and second ends 239a, 245a and opposed first and second edges 242a, 248a that extend between the ends. The thermal sheet 206a can be manufactured out of any material having high heat conductivity and that is bendable/flexible (e.g., pyrolytic graphite sheet, graphene, carbon fiber sheet, copper, aluminum).

Each of the thermal sheets 206a, 206b is attached to the pad 203 by an adhesive 251. The adhesive 251 can be applied to the pad 203 and/or the thermal sheets 206a, 206b. The adhesive 251 connects the pad facing surface 230a, 230b to the first and second surfaces 209, 212 of the pad 203. Consequently, the pad facing surface 230a, 230b faces toward the pad 203 and the component facing surface 233a, 233b faces away from the pad 203. In this configuration, the thermal sheet 206a, 206b has an interconnecting portion 254a, 254b that interconnects first heat transfer portions 257a, 257b and second heat transfer portions 260a, 260b. The first heat transfer portion 257a, 257b is proximal to the first surface 209 of the pad 203. The second heat transfer portion 260a, 260b is proximal to the second surface 212 of the pad 203.

In one example, the thermal sheets 206a, 206b are arranged on the pad 203 such that the interconnecting portion 254a, 254b extends about the first and second ends 221, 227, respectively. However, it is contemplated that the first and second thermal sheets 206a, 206b can be arranged on the pad 203 such that the interconnecting portion 254a, 254b of a respective thermal sheet extends about any combination of the ends 221, 227 and/or the edges 218, 225 of the pad 203.

In one example, the first ends 239a, 239b of the first and second thermal sheets 206a, 206b are spaced from one another and arranged to be disposed on a middle portion of the first surface 209 of the pad 203 (i.e., halfway between the first end 221 and the second end 227). Similarly, the second ends 245a, 245b of the first and second thermal sheets 206a, 206b are spaced from one another and arranged to be disposed on a middle portion of the second surface 212 of the pad 203. However, it is contemplated that the first and second thermal sheets 206a, 206b can be arranged on the pad 203 such that the first and/or second ends 239a, 239b, 245a, 245b of the respective thermal sheet abut one another. Additionally, it is contemplated that the first and second thermal sheets 206a, 206b can be arranged on the pad such that the first and/or second ends 239a, 239b, 245a, 245b of the respective thermal sheet are disposed at a location other than the middle portion of the first and second surfaces 209, 212 of the pad 203.

Figure 6:
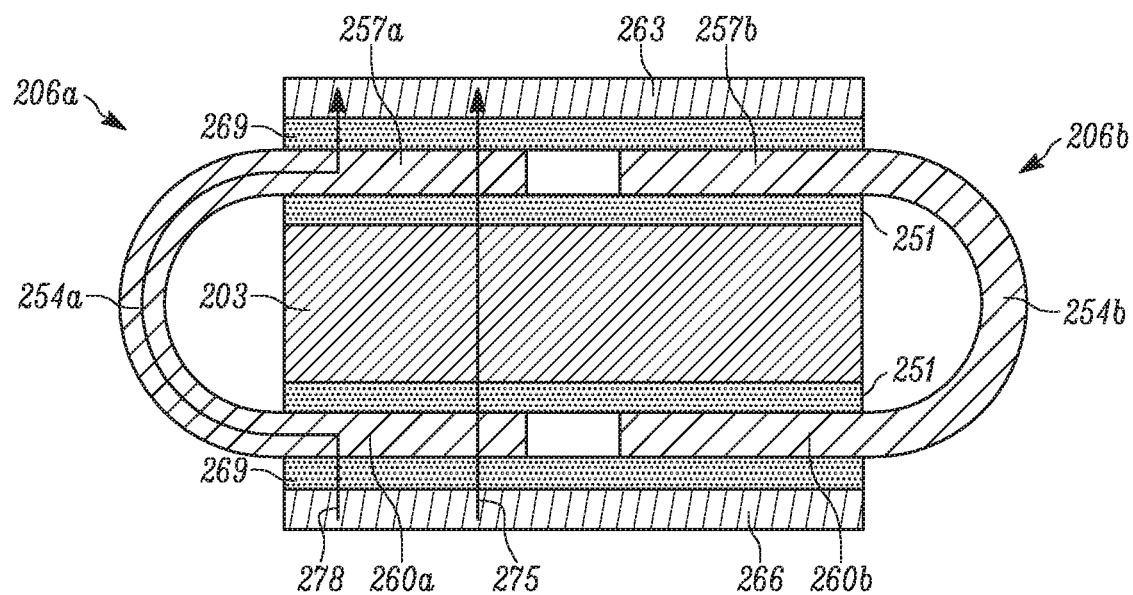
FIG. 6 is a side view of the thermal assembly of FIG. 2 between a heat generating component and a heat dissipating component.
Figure 7:
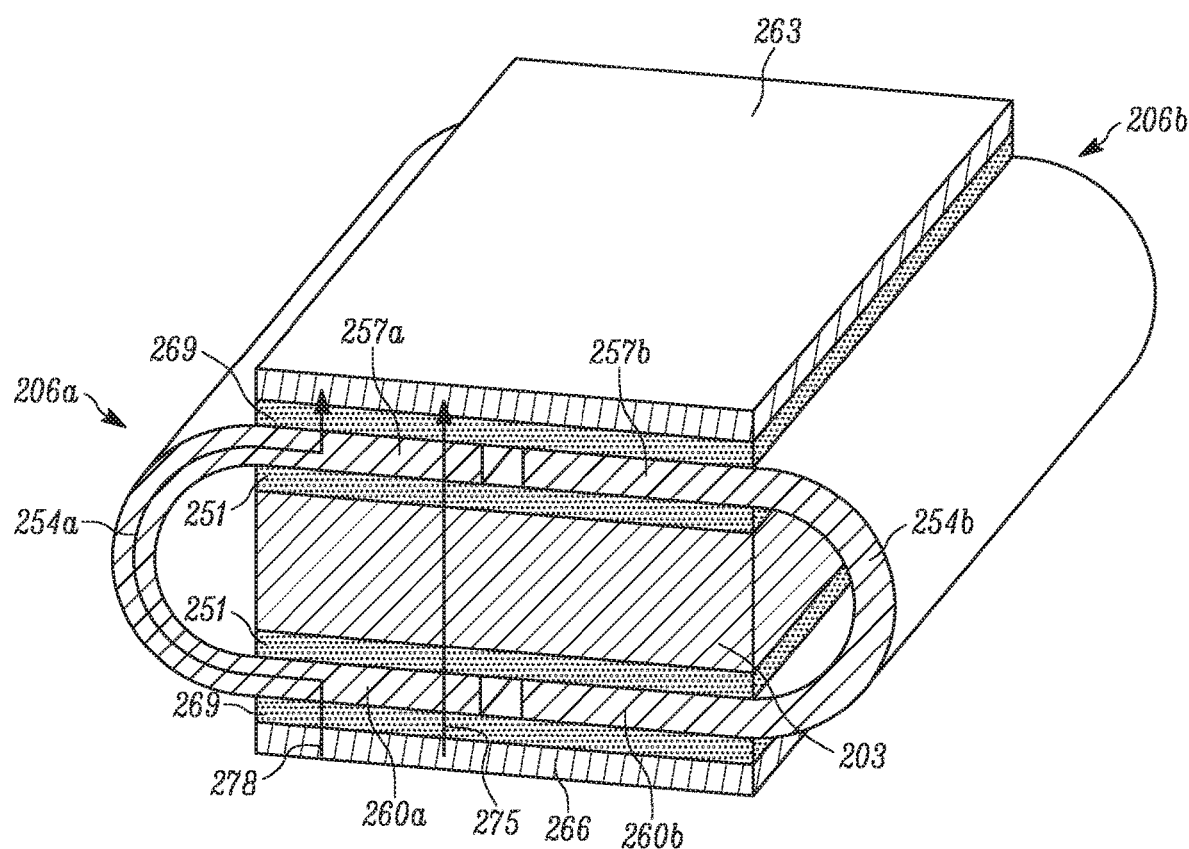
FIG. 7 is a perspective view of the thermal assembly of FIG. 2 between a heat generating component and a heat dissipating component.

The thermal interface assembly 200 can be disposed between a heat generating component 266 and a heat dissipating component 263 (FIGS. 6 and 7). Adhesive 269 can be used to attach the first heat transfer portion 257a, 257b of each of the first and second thermal sheets 206a, 206b to the heat generating component 266. Adhesive 269 can also be used to attach the second heat transfer portion 260a, 260b of each of the first and second thermal sheets 206a, 206b to the heat dissipating component 263. It is contemplated that any other suitable mechanism or arrangement can be used to attach the thermal interface assembly 200 to the heat generating component and/or the heat dissipating component 263, 266 (e.g., mechanical fasteners).

The heat dissipating component 263 is provided to dissipate heat generated by the heat generating component 266. The thermal interface assembly 200 is configured to promote heat transfer from the heat generating component 266 to the heat dissipating component 263. Heat moving through the thermal interface assembly 200 moves along a through-plane path 275 and an in-plane path 278. Heat moving along the through-plane path 275 begins at the heat generating component 266, moves to the first heat transfer portion 257a, 257b, through the pad 203, to the second heat transfer portion 260a, 260b, and to the heat dissipating component 263. Heat moving along the in-plane path 278 begins at the heat generating component 266, moves to the first heat transfer portion 257a, 257b and along the curved portion 254a, 254b to the second heat transfer portion 260a, 260b, and to the heat dissipating component 263. That is, heat moving along the in-plane path 278 remains in the thermal sheet 206a, 206b as the heat moves from the heat generating component 266 to the heat dissipating component 263. The in-plane path 278 is the primary means of heat transfer from the heat generating component 266 to the heat dissipating component 263 due to the chemical structure of the thermal sheet 206a, 206b and the construction of the thermal interface assembly 200. The relatively short in-plane path improves heat transfer from the heat generating component 266 to the heat dissipating component.

Figure 8:
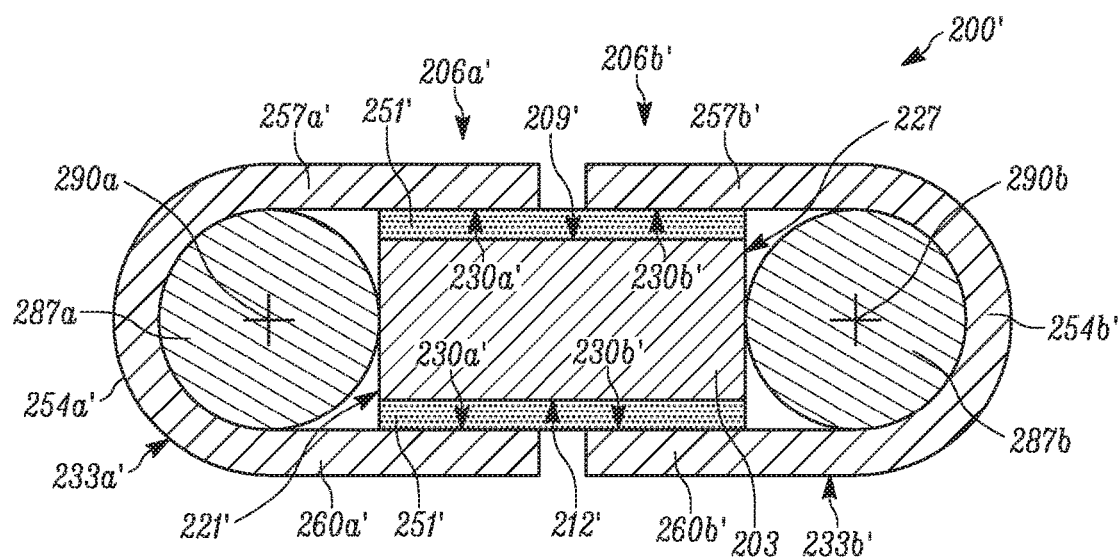
FIG. 8 is a side view of a thermal interface assembly according to another embodiment of the invention.
Figure 9:
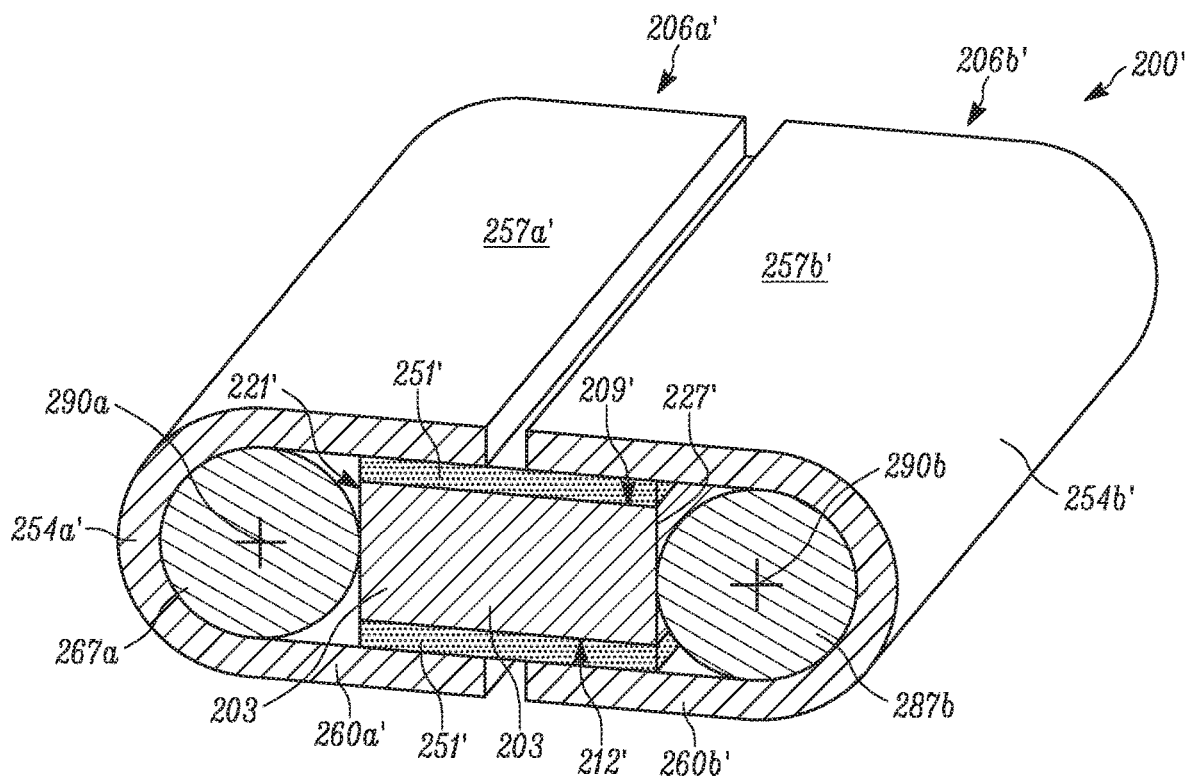
FIG. 9 is a perspective view of the thermal interface assembly of FIG. 8.

A thermal interface assembly 200' according to another embodiment of the invention is shown in FIGS. 8 and 9. The thermal interface assembly 200' of FIGS. 8 and 9 is a variant of the thermal interface assembly 200 of FIGS. 2-5. As such, the description of the thermal interface assembly 200' of FIGS. 8 and 9 will focus on details that differentiate the thermal interface assembly 200' of FIGS. 8 and 9 from the thermal interface assembly 200 of FIGS. 2-5. Like features will be identified by like numerals appended with a prime (').

The thermal interface assembly 200' includes a resilient pad 203', a first thermal sheet 206a', and a second thermal sheet 206b'. The first and second thermal sheets 206a', 206b' are attached to the pad 203' by an adhesive 251'. Each of the first and second thermal sheets 206a', 206b' are attached to the pad 203' such that a pad facing surface 230a', 230b' faces toward the pad 203' with a component facing surface 233a', 233b' facing away from the pad 203'. In this configuration, each of the first thermal sheet and the second thermal sheet 206a', 206b' has an interconnecting portion 254a', 254b' that interconnects first heat transfer portions 257a', 257b' and second heat transfer portions, 260a', 260b'.

The thermal interface assembly 200' includes a first guide 287a and a second guide 287b. In one example, each of the first and second guides 287a, 287b is substantially cylindrically shaped and has a longitudinal axis 290. However, it is contemplated that the first guide and/or the second guide 287a, 287b can be any desired shape.

The first guide 287a is disposed between the interconnecting portion 254a' of the first thermal sheet 206a' and the first end 221' of the pad 203' such that the longitudinal axis 290a of the first guide 287a extends parallel to the first and second surfaces 209' 212' of the pad 203'. The second guide 287b is disposed between the interconnecting portion 254b' of the second thermal sheet 206b' and the second end 227' of the pad 203' such that the longitudinal axis 290b of the second guide 287b extends parallel to the first and second surfaces 209', 212' of the pad 203'. In one example, the guides 287a, 287b are in contact with the interconnecting portion 254a', 254b' of the respective thermal sheets 206a', 206b' and the respective ends 221', 227' of the pad 203'. However, it is contemplated that the first guide and/or the second guide 287a, 287b can be spaced from the thermal sheets 206a', 206b' and/or the pad 203'.

The thermal sheets 206a', 206b' can have a minimum radius of curvature that should not be exceeded so as to reduce risk of breaking the thermal sheets. Breaking of the thermal sheets 206a', 206b' is undesirable because it can reduce the ability of the thermal sheets to transfer heat along the in-plane path. The presence of the guides 287a, 287b between the thermal sheets 206a', 206b' and the pad 203' provides a structure against which the thermal sheets can rest as the thermal sheets are attached to the pad, thereby reducing the chance that the minimum radius of curvature is exceeded and reducing the chance of breaking the thermal sheets.

A thermal interface assembly 400 according to another embodiment of the invention is shown in FIGS. 10-13 and 15-16. The thermal interface assembly includes a resilient pad 403 and four thermal sheets 406a, 406b, 406c, 406d. The pad 403 (FIG. 15) includes a first surface 409 and a second surface 412. The first and second surfaces 409, 412 are bound by opposed first and second ends 421, 427 and opposed first and second edges 418, 424 that extend between the ends.

Figure 14:
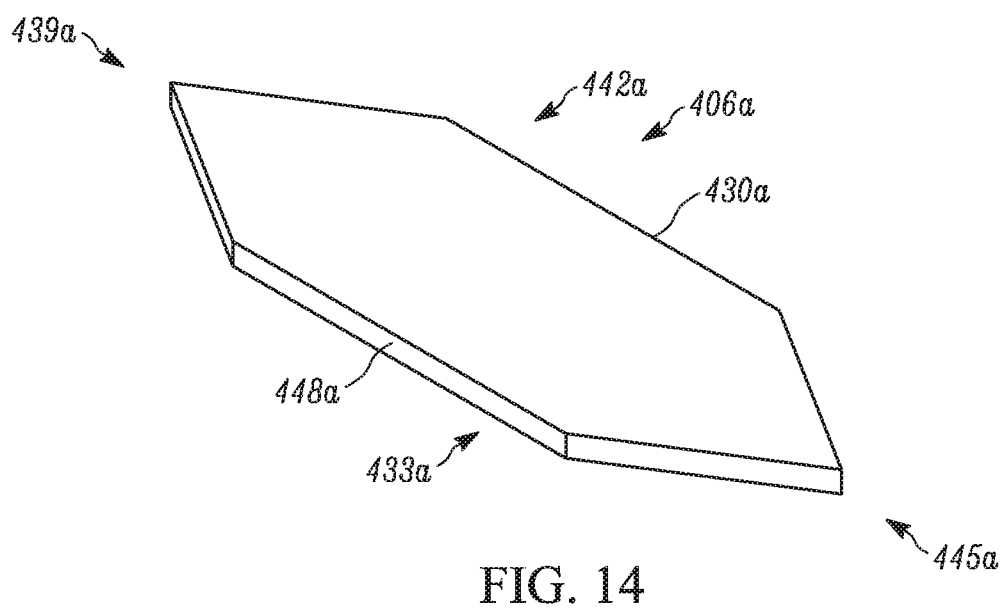
FIG. 14 is a perspective view of a thermal sheet that makes up part of the thermal assembly of FIG. 10.
Figure 15:
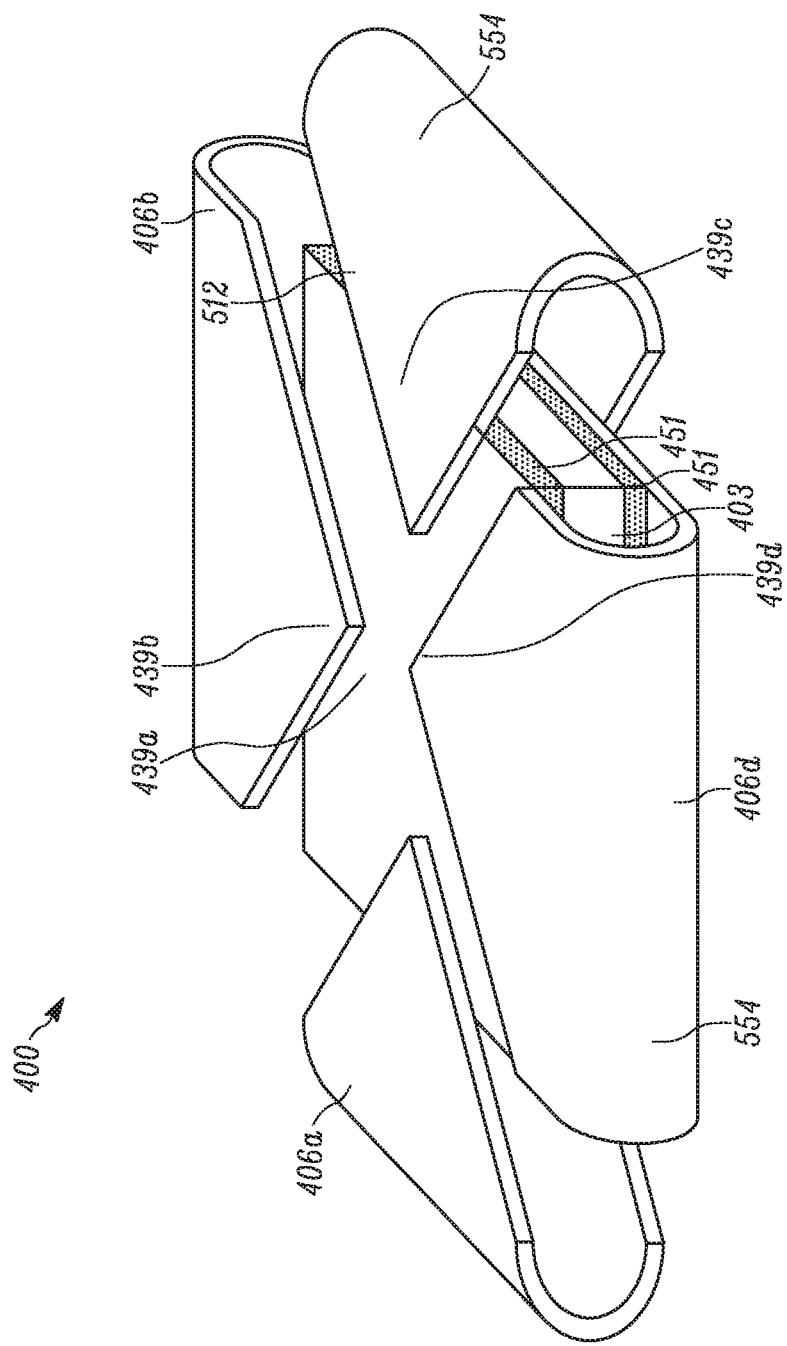
FIG. 15 is a perspective view of a partially assembled thermal interface assembly of FIG. 10.
Figure 16:
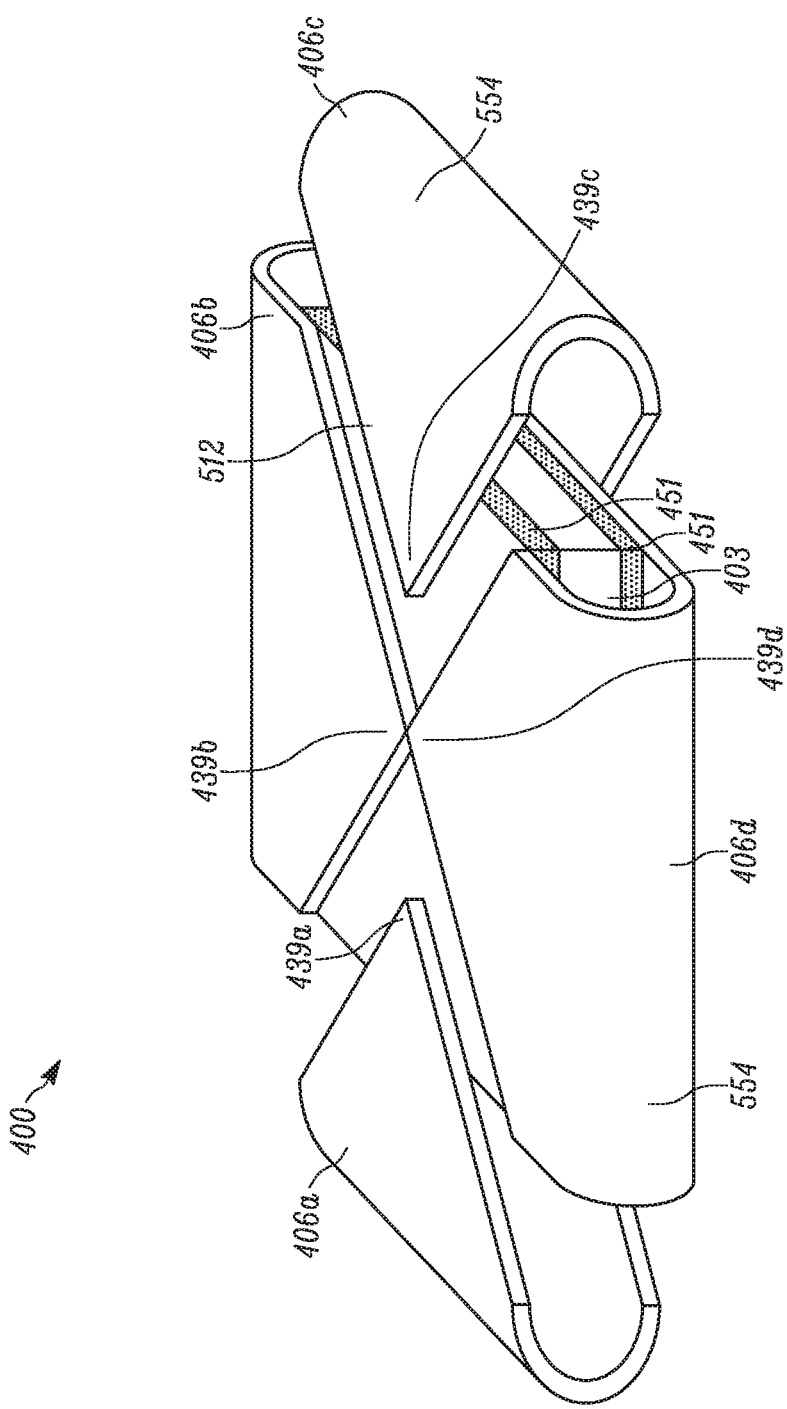
FIG. 16 is a perspective view of a further partially assembled thermal interface assembly of FIG. 10.

The four thermal sheets 406a, 406b, 406c, 406d are substantially identical to one another. As such, the discussion of the thermal sheets 406a, 406b, 406c, 406d will be made with reference to a single thermal sheet 406a (FIG. 14). The thermal sheet 406a includes a pad facing surface 430a and a component facing surface 433a. The pad facing surface 430a and the component facing surface 433a are bound by opposed first and second ends 439a, 445a and opposed first and second edges 442a, 448a that extend between the ends. The first and second ends 439a, 445a are tapered.

Each of the thermal sheets 406a, 406b, 406c, 406d is attached to the pad 403 by an adhesive 451. The adhesive 451 connects the pad facing surface 430a, 430b, 430c, 430d to the first and second surfaces 409, 412 of the pad 203. Consequently, the pad facing surface 430a, 430b, 430c, 430d faces toward the pad 403 and the component facing surface 433a, 433b, 433c, 433d faces away from the pad 403. In this configuration, the thermal sheets 406a, 406b, 406c, 406d have an interconnecting portion 454a, 454b, 454c, 454d that interconnects first heat transfer portions 457a, 457b, 457c, 457d and second heat transfer portions 460a, 460b, 460c, 460d. The first heat transfer portion 457a, 457b, 457c, 457d is proximal to the first surface 409 of the pad 403. The second heat transfer portion 460a, 460b, 460c, 460d is proximal to the second surface 412 of the pad 403. The thermal sheets 406a, 406b, 406c, 406d are arranged on the pad 403 such that the interconnecting portions 454a, 454b, 454c, 454d extend about the first end 421, the first edge 418, the second end 427, and the second edge 424, respectively.

Figure 10:
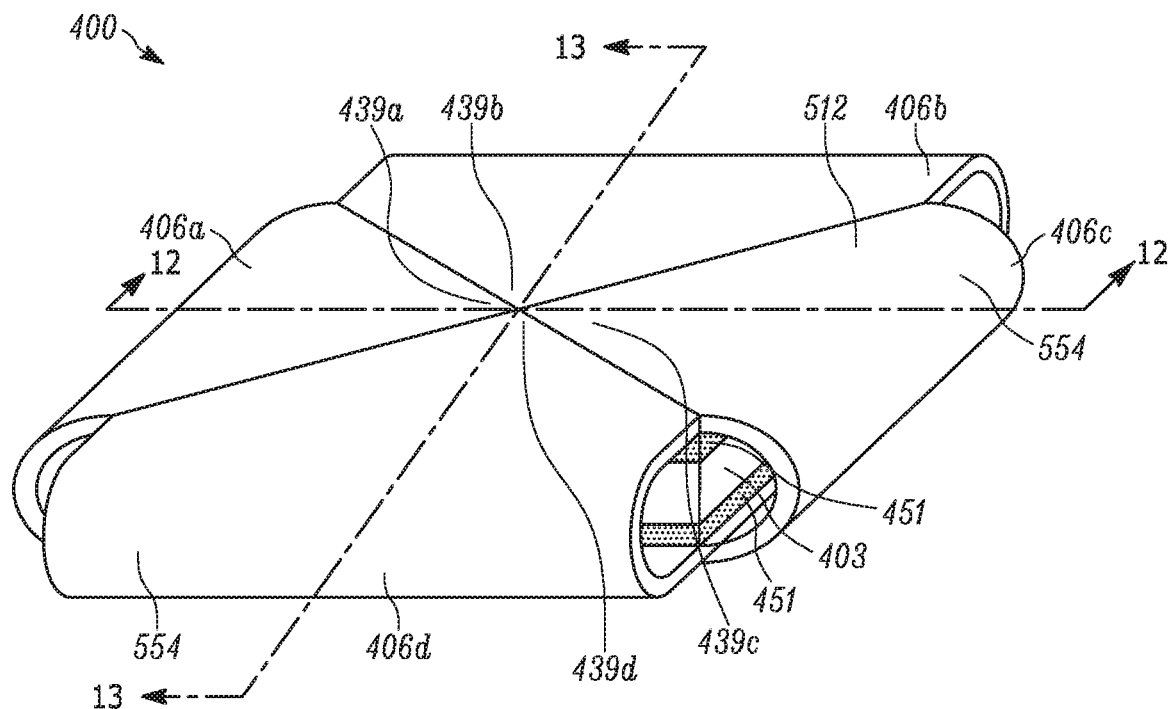
FIG. 10 is a perspective view of a thermal interface assembly according to another embodiment of the invention.
Figure 11:
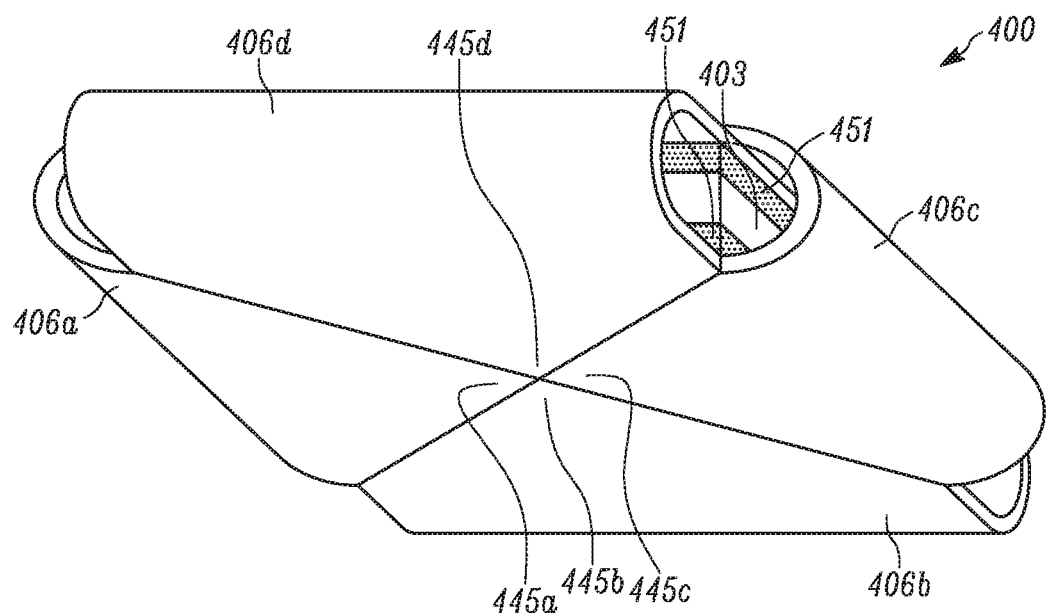
FIG. 11 is another perspective view of the thermal interface assembly of FIG. 10.
Figure 12:
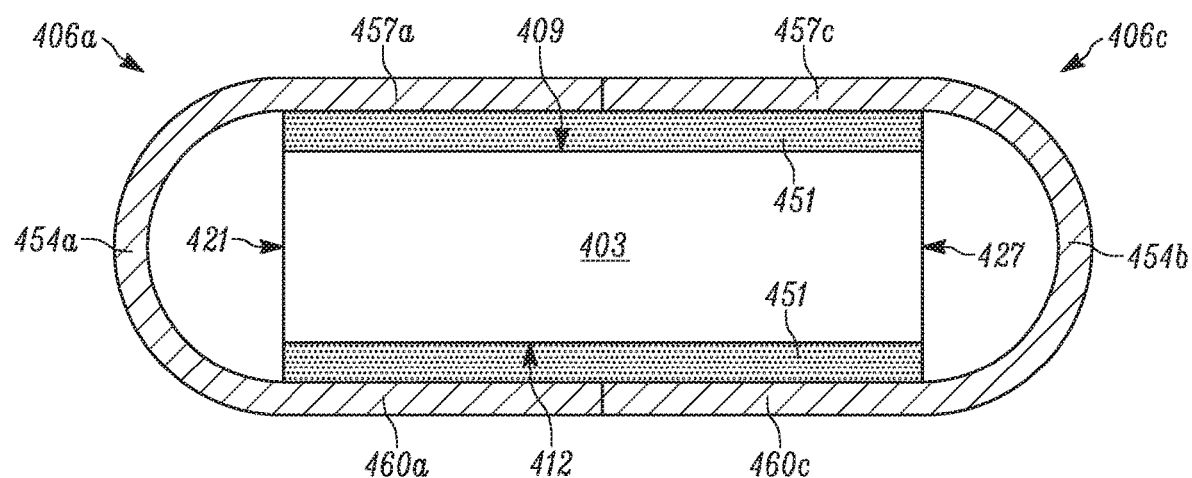
FIG. 12 is a sectional view along 12-12 of FIG. 10.
Figure 13:
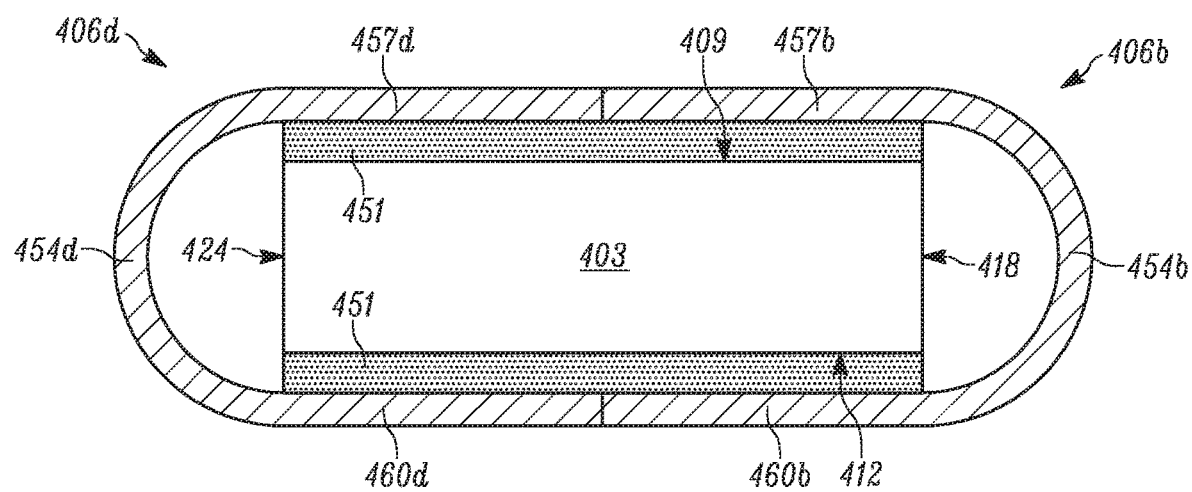
FIG. 13 is a sectional view along 13-13 of FIG. 10.

In one example, the first ends 439a, 439b, 439c, 439d of the thermal sheets 406a, 406b, 406c, 406d meet at a middle portion of the first surface 409 of the pad 403 such that adjacent ends abut one another (FIG. 10). Similarly, the second ends 442a, 442b, 442c, 442d of the thermal sheets 406a, 406b, 406c, 406d meet at a middle portion of the second surface 412 of the pad 403 such that adjacent ends abut one another (FIG. 11). However, it is contemplated that the thermal sheets 406a, 406b, 406c, 406d can be arranged on the pad 403 such that the first and/or second ends 439a, 439b, 439c, 439d, 442a, 442b, 442c, 442d are spaced apart from one another. It is also contemplated that the thermal sheets 406 can be arranged on the pad 403 such that the first and/or second ends 439a, 439b, 439c, 439d, 442a, 442b, 442c, 442d are disposed at a location other than the middle portion of the first and second surfaces 409, 412 of the pad 403. The provision of additional thermal sheets improves heat transfer from a heating generating component to a heat dissipating component.

The combination of a plurality of thermal sheets disposed about a resilient pad provides an assembly that is flexible and has excellent thermal conductivity. The resilient pad provides the desired flexibility that reduces compressive forces during assembly of an electronic device. The plurality of thermal sheets provides increased levels of heat transfer from heat generating components to heat dissipating components compared to the known assembly of FIG. 1, which utilizes only a single thermal sheet. Additionally, as compared to the known assembly of FIG. 1, the distance between the ends 239, 245 of the thermal sheets 206 of the embodiment of FIGS. 2-5 and the distance between the ends 439, 445 of the thermal sheets 406 of the embodiment of FIGS. 10-13 and 15-16 is decreased. As a result, the in-plane path for heat transfer is decreased, thereby improving heat transfer efficiency. Furthermore, it has been found that, because heat transfer is being split between two or more thermal sheets, the overall temperature of each thermal sheet is decreased as compared to the known assembly of FIG. 1.

What have been described above are examples of the disclosure. It is, of course, not possible to describe every conceivable combination of components or method for purposes of describing the disclosure, but one of ordinary skill in the art will recognize that many further combinations and permutations of the disclosure are possible. For example, the guides 287a, 287b shown in the thermal interface assembly 200' of FIGS. 8 and 9 can be provided to any other of the disclosed thermal interface assemblies. As another example, the tapered ends 439, 445 of the thermal interface 400 assembly of FIGS. 10-13 and 15-16 can be provided to any other of the disclosed thermal interface assemblies. As another example, the tapered ends 439, 445 can be tapered in a manner other than what is specifically illustrated. As yet another example, the resilient pad and/or the thermal sheets of any one of the aforementioned embodiments can be provided as any desired shape. Accordingly, the disclosure is intended to embrace all such alterations, modifications, and variations that fall within the scope of this application, including the appended claims.

The invention claimed is:

1. A thermal interface assembly for connecting a heat dissipating component to a heat generating component, the thermal interface assembly comprising:
   a resilient pad having first and second opposite surfaces;
   a plurality of discrete thermal sheets, each of the plurality of discrete thermal sheets being configured to transfer heat from the heat generating component to the heat dissipating component along an in-plane path, each of the plurality of thermal sheets having first and second heat transfer portions interconnected by an interconnecting portion, the first heat transfer portion being attached to the first surface of the resilient pad, the second heat transfer portion being attached to the second surface of the resilient pad, the interconnecting portion extending about an edge of the pad; and
   a guide disposed between the pad and at least one of the interconnecting portions, the guide being arranged to maintain a radius of curvature of the at least one interconnecting portion.

2. The thermal interface assembly of claim 1, wherein an end of one sheet of the plurality of thermal sheets is spaced from an end of another sheet of the plurality of thermal sheets.

3. The thermal interface assembly of claim 1, wherein an end of one sheet of the plurality of thermal sheets abuts an end of another sheet of the plurality of thermal sheets.

4. The thermal interface assembly of claim 1, wherein ends of the plurality of thermal sheets are tapered.

5. The thermal interface assembly of claim 1 comprising adhesive, the adhesive attaching the first heat transfer portion to the first surface of the pad and attaching the second heat transfer portion to the second surface of the pad.

6. A thermal interface assembly comprising:
   a resilient pad;
   a plurality of discrete thermal sheets, each of the plurality of discrete thermal sheets being configured to transfer heat from a heat generating component to a heat dissipating component along an in-plane path, each of the plurality of thermal sheets having a first surface and a second surface, each of the plurality of thermal sheets being attached to the pad such that the first surface faces toward the pad and the second surface faces away from the pad; and
   a guide disposed between the pad and at least one of the interconnecting portions, the guide being arranged to maintain a radius of curvature of the at least one interconnecting portion.

7. The thermal interface assembly of claim 6, wherein an end of one sheet of the plurality of thermal sheets is spaced from an end of another one sheet of the plurality of thermal sheets.

8. The thermal interface assembly of claim 6, wherein an end of one sheet of the plurality of thermal sheets abuts an end of another one sheet of the plurality of thermal sheets.

9. The thermal interface assembly of claim 6, wherein ends of the plurality of thermal sheets are tapered.

10. The thermal interface assembly of claim 1 comprising adhesive, the adhesive attaching the first surface of each of the plurality of thermal sheets to the pad.

11. An electronic assembly comprising:
    a thermal interface assembly according to claim 1
    a heat generating component attached to the first heat transfer portion; and
    a heat dissipating component attached to the second heat transfer portion;
    wherein each of the plurality of discrete thermal sheets is configured to transfer heat from the heat generating component to the heat dissipating component along an in-plane path.

12. The thermal interface assembly of claim 1, wherein the first heat transfer portion of each of the plurality of thermal sheets is attached to the same first surface of the resilient pad.

13. The thermal interface assembly of claim 1, wherein the second heat transfer portion of each of the plurality of thermal sheets is attached to the same second surface of the resilient pad.

14. The thermal interface assembly of claim 6, wherein the first surface of each of the plurality of thermal sheets faces toward the same pad.

15. The thermal interface assembly of claim 14 wherein the second surface of each of the plurality of thermal sheets faces away from the same pad.

* * * * *